US 9,794,126 B2

(12) United States Patent
Gang

(10) Patent No.: US 9,794,126 B2
(45) Date of Patent: Oct. 17, 2017

(54) DATA COMPRESSION OF A SEQUENCE OF BINARY DATA

(71) Applicant: Simmonds Precision Products, Inc., Vergennes, VT (US)

(72) Inventor: Travis Gang, Burlington, VT (US)

(73) Assignee: Simmonds Precision Products, Inc., Vergennes, VT (US)

( * ) Notice: Subject to any disclaimer, the term of this patent is extended or adjusted under 35 U.S.C. 154(b) by 0 days.

(21) Appl. No.: 14/938,560

(22) Filed: Nov. 11, 2015

(65) Prior Publication Data
US 2017/0134234 A1    May 11, 2017

(51) Int. Cl.
H04B 1/66        (2006.01)
H04L 12/24       (2006.01)
H04L 29/06       (2006.01)
H03M 7/30        (2006.01)

(52) U.S. Cl.
CPC .......... H04L 41/0896 (2013.01); H03M 7/30 (2013.01); H04L 41/0826 (2013.01); H04L 69/22 (2013.01)

(58) Field of Classification Search
CPC ........ H03M 7/3059; H03M 7/42; H03M 7/30; G06F 17/30153
USPC ............................. 382/244; 714/763; 708/203
See application file for complete search history.

(56) References Cited

U.S. PATENT DOCUMENTS

| 5,724,033 | A | 3/1998 | Burrows |
| 5,819,740 | A | 10/1998 | Muhlenberg |
| 6,222,942 | B1 * | 4/2001 | Martin ............... H03M 7/42 345/555 |
| 2009/0201182 | A1 | 8/2009 | Wegener |

FOREIGN PATENT DOCUMENTS

GB    2294618 A    5/1996

OTHER PUBLICATIONS

Reghbati, H.K., "An Overview of Data Compression Techniques", Institute of Electrical and Electronics Engineers, Apr. 1981, 5 pages.
Wu, Wei Biao, "The Performance of Difference Coding for Sets and Relational Tables", Journal of the ACM, vol. 50, No. 3, Sep. 2003, 29 pages.
Extended European Search Report, for European Patent Application No. 16198194.9, dated Mar. 10, 2017, 8 pages.

* cited by examiner

Primary Examiner — Rahel Guarino
(74) Attorney, Agent, or Firm — Kinney & Lange, P.A.

(57) ABSTRACT

Apparatus and associated methods relate to compressing a sequence of binary data by encoding difference values between adjacent data in the sequence. For each datum in the sequence, the difference value may be determined by comparing the datum with an immediately preceding datum. For data, the determined difference may be expressible using few bits. The determined difference is encoded in subwords having subword lengths selected from a set of predetermined subword lengths. The selected subword lengths may be a minimum one of the set of predetermined subword sizes that is capable of representing the difference between the adjacent data. A size tag is generated for each subword encoded. The size tag identifies the size of the subword selected and used for encoding the determined difference. The difference may be encoded as a mathematical difference or as a bit pattern difference.

20 Claims, 5 Drawing Sheets

DATA COMPRESSION OF A SEQUENCE OF BINARY DATA

BACKGROUND

Signal compression has been performed in both the analog domain and in the digital domain. Digital data compression can be performed in either a lossy manner or in a lossless manner. Various data compression methods have been performed. Each such data compression method is well-suited for sequences of data having certain specific intra-sequence relationships. For example, image compression schemes can leverage the nature of images, wherein most images exhibit relatively low-frequency spatial variations, especially locally within sub-regions of the image. Some data compression techniques are well suited to compressing sequences of data that have repeating sub-sequences.

Some systems are designed to frequently monitor system parameters. Some such system parameters are measured using transducers and A/D converters. Frequent monitoring of such system parameters can generate a large number of data elements. Storing such large numbers of data elements can require large amounts of memory. Systems that communicate large numbers of data elements can require large bandwidth channels. Large amounts of memory and large bandwidth channels can each incur high costs, and require high operating-power levels. Compressing such frequently monitored system parameters could be beneficial in terms of reducing power, memory requirements, and costs, among other savings.

SUMMARY

A binary data encoding system for compressing a sequence of binary data includes a receiver configured to receive a sequence of words of binary data. The binary data encoding system includes a comparator configured to compare pairs of adjacent words of the sequence, and to determine a difference between a second word and a first word of each of the pairs of adjacent words. The binary data encoding system includes a selector configured to select a subword size from a set of predetermined subword sizes, the selected subword size being a minimum one of the set of predetermined subword sizes that is capable of representing the determined difference between the second word and the first word of each of the pairs of adjacent words. The binary data encoding system includes an encoding engine configured to generate a size tag and a corresponding subword of the selected subword size, the size tag indicative of the selected subword size and the corresponding subword representing the determined difference between the second word and the first word of each of the pairs of adjacent words. The binary data encoding system also includes a buffer configured to output the generated size tag and subword.

In some embodiments, a binary data decoding system for uncompressing a compressed sequence of data elements includes a receiver configured to receive the compressed sequence of data elements, each of the data elements including a size tag and a corresponding word or subword. The binary data decoding system includes a parser configured to parse the size tag and the corresponding word or subword from the received data elements, the size tag indicative of either a representation of a word or a subword size. If the size tag indicates a representation of a word, the parser parses a representation of a word. If, however, the size tag indicates a subword size, the parser parses a subword of the indicated subword size. The binary data decoding system includes a decoding engine configured to generate an uncompressed word from the parsed size tag and the corresponding parsed word or subword. If the size tag indicates a representation of a word, the representation of the word is output as a next element. If, however, the size tag indicates a subword size, the parsed subword is used to modify a previous element to generate and output the next element.

A method of reducing a bandwidth required to communicate a sequence of words of binary data includes the step of receiving a first binary word of data. The method includes the step of receiving a second binary word of data. The method includes the step of comparing the second binary word of data with the first binary word of data. The method includes the step of determining a difference between the first binary word of data and the second binary word data. The method includes the step of selecting a subword size from a set of predetermined subword sizes, the selected subword size being capable of representing the determined difference. The method includes the step of generating a subword of the selected subword size, the subword representing the determined difference. The method also includes the step of outputting the generated subword and a tag indicating the selected subword size of the generated subword.

DETAILED DESCRIPTION

Apparatus and associated methods relate to compressing a sequence of binary data by encoding difference values between adjacent data in the sequence. For each datum in the sequence, the difference value may be determined by comparing the datum with an immediately preceding datum. For data, the determined difference may be expressible using few bits. The determined difference is encoded in subwords having subword lengths selected from a set of predetermined subword lengths. The selected subword lengths may be a minimum one of the set of predetermined subword sizes that is capable of representing the difference between the adjacent data. A size tag is generated for each subword encoded. The size tag identifies the size of the subword selected and used for encoding the determined difference. The difference may be encoded as a mathematical difference or as a bit pattern difference.

Figure 1:
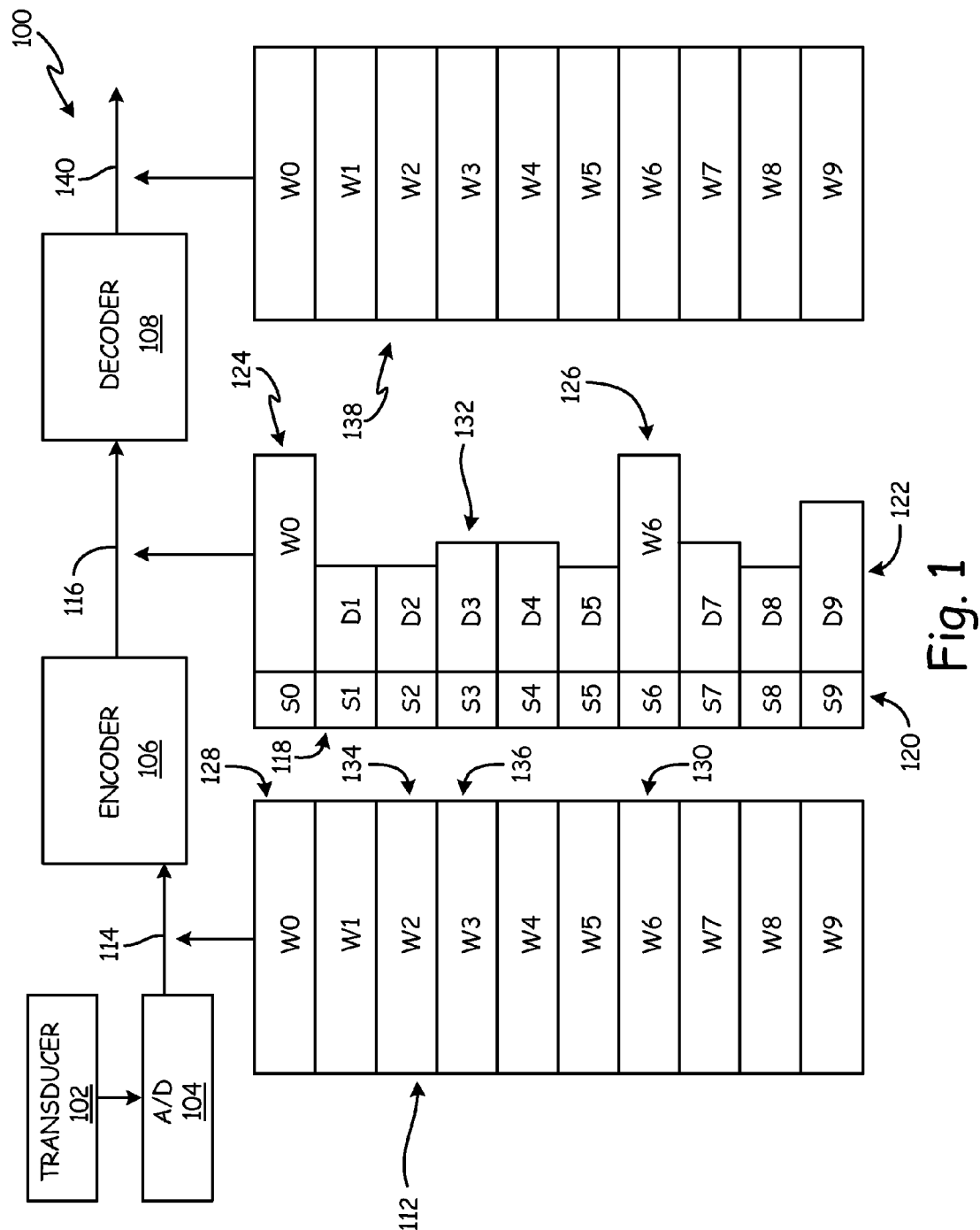
FIG. 1 is a schematic representation of a binary data encoding/decoding system for compressing a sequence of binary data.

FIG. 1 is a schematic representation of a binary data encoding/decoding system for compressing a sequence of binary data. In FIG. 1, binary data encoding/decoding system 100 includes transducer 102, A/D converter 104, encoder 106, and decoder 108. Transducer 102 senses a physical parameter and converts the sensed physical parameter into an electrical signal. The electrical signal representative of the sensed physical parameter is output to node 110. A/D converter 104 receives the electrical signal representative of the sensed physical parameter from node 110. A/D converter 104 periodically converts the received electrical signal to a digital representation. Such periodic conversion of the received electrical signals results in a sequence of words of binary data depicted in table 112. Each row of table 112 represents a word of binary data. Each word of binary data in table 112 is of the same size. Sequences of words of equal size can be produced, for example, from an output of A/D converter 104. A/D converter 104 outputs the digital representations to node 114.

Encoder 106 receives the digital representations from node 114. Encoder 106 encodes each of the digital representations and outputs each of the encoded representations to node 116. The encoded representations of the periodic digital representations result in a sequence of words of binary data depicted in table 118. As shown, each of the rows of table 118 corresponds to a row of table 112. Each row of table 118 has two columns, including size column 120 and data column 122. Size column 120 contains binary data indicative of a size of data column 122. Also, the elements of table 118 have different lengths. Elements 124, 126 are representations of the corresponding words 128, 130 of table 112. Element 132, for example, might represent a difference between adjacent pair of elements 134, 136.

Decoder 108 receives the encoded representations from node 116. Decoder 108 then decodes the encoded sequence generating a sequence of words of binary data as depicted in table 138. Table 138 is identical to table 112. Table 138 will be identical to table 112 if the encoding method used by encoder 106 is lossless. In some embodiments, encoder 106 may use a lossy encoding method. In such embodiments, table 138 may slightly differ from table 112. Decoder 108 outputs the decoded sequence of binary words to node 140.

The average size of the elements of table 118 is less than the size of each of the elements of tables 112, 138. Because the average size of the elements of table 118 is small in comparison to the elements of tables 112, 138, a smaller bandwidth can be used to communicate the data represented in table 118. Furthermore, the data can be stored using less memory than would be required to store the data in either of tables 112, 138.

A sequence of binary data can be characterized and/or analyzed so as to determine an optimal compression method for such sequence of binary data. A set of subword sizes can be optimally selected based upon the characterization and/or analysis of the sequence. Some sequences of binary data may lend themselves to using very small sizes of subwords, for example. Other sequences of binary data may require larger sizes of subwords to represent differences between adjacent data. Some sequences may be consistent in the magnitude of the differences between adjacent data, while others may be less consistent. The more consistent sequences may benefit from a smaller size tag—a 1-bit size tag, for example. The less consistent sequences may benefit from a larger number of subword sizes in the set of predetermined subword sizes, and thus might require a larger size tag—a 2-bit or 3-bit size tag, for example. In an exemplary embodiment, a value of 0 for the size tag might indicate that the size tag is that of the previously transmitted datum, while a value of 1XX for the size tag might indicate a new subword size indicated by the XX values.

Various embodiments may have various advantages. For example, high compression ratios may be achieved in systems that have differences that can be expressed using few bits. Such high compression ratios can reduce the memory requirements for systems that store the sequence of data. Such high compression ratios also can reduce the bandwidth requirement to transmit the sequence of data. Reducing memory and/or power requirements can result in cost savings for systems using such compression techniques.

Figure 2:
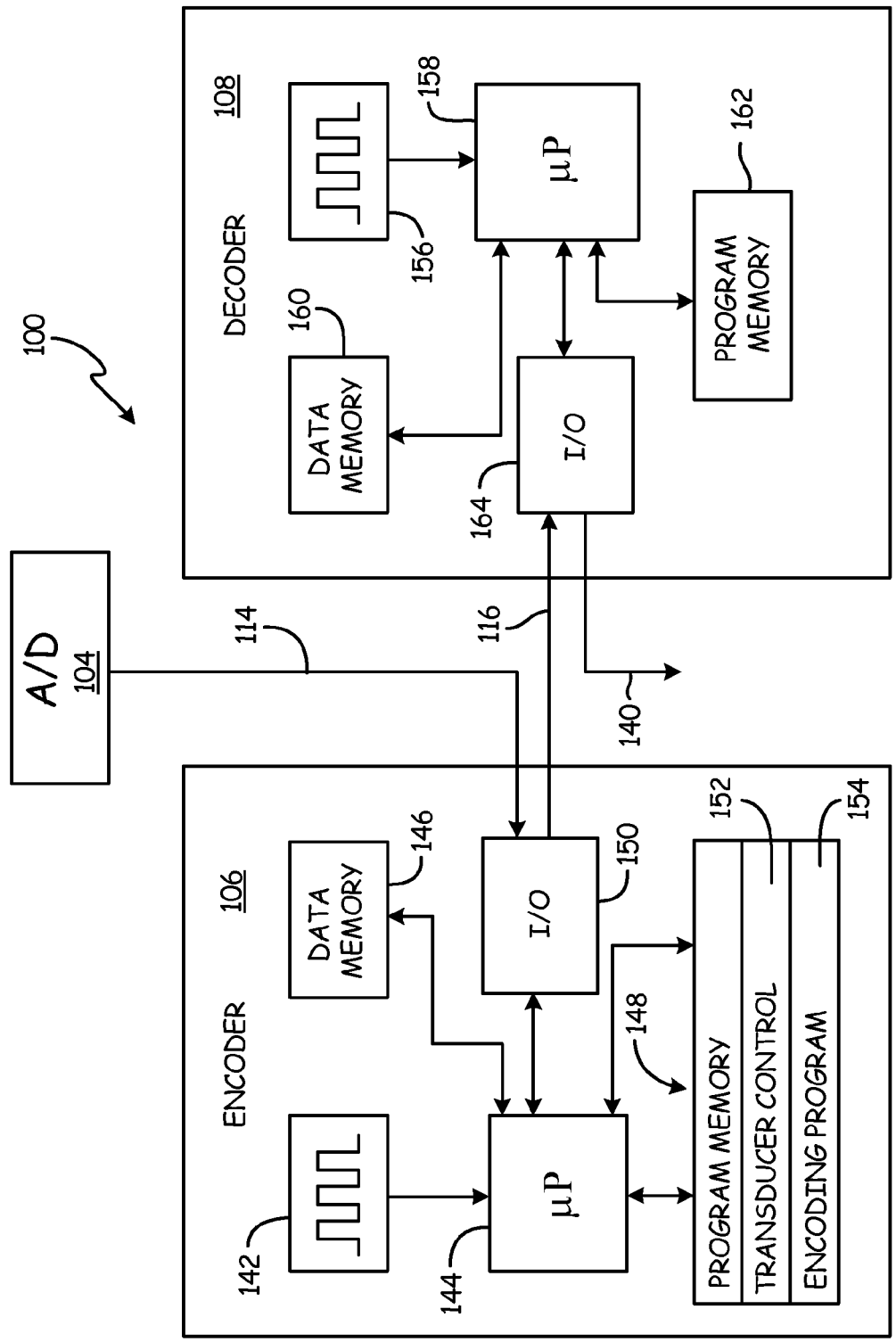
FIG. 2 is a block diagram of an exemplary codec system configured to encode uncompressed data and configured to decode data compressed using adjacent word comparison and variably-sized subwords.

FIG. 2 is a block diagram of an exemplary codec system configured to encode uncompressed data and configured to decode data compressed using adjacent word comparison and variably-sized subwords. As shown in FIG. 2, binary data encoding/decoding system 100 includes A/D converter 104, encoder 106, and decoder 108. A/D converter 104 communicates digital representations to encoder 106 via node 114. Encoder communicates electrical data to decoder 108 via node 116. Decoder outputs electrical signals to node 140.

Encoder 106 includes clock 142, microprocessor 144, data memory 146, program memory 148, and input/output interface 150. Program memory 148 includes transducer control program 152 and encoding program 154. Microprocessor 144 is configured to receive clock signals from clock 142. Microprocessor 144 may retrieve one or more operating programs from program memory 148. For example, microprocessor 144 may retrieve transducer control program 152, a program to control A/D converter 104, and data encoding program 154. When running the program to control A/D converter 104, microprocessor 144 may send command signals to A/D converter 104 via input/output interface 150, for example. Microprocessor may then receive digital representations from A/D converter 104 via input/output interface 150. Microprocessor 144 is also configured to retrieve data from and/or store data to data memory 146. Data memory 146 may be used to temporarily store uncompressed data received from A/D convertor 104 for example. Data memory 146 may also be used to store compressed data before it is transmitted to decoder 108 via input/output interface 150.

Decoder 108 includes clock 156, microprocessor 158, data memory 160, program memory 162 and input/output interface 164. Program memory 162 may include, for example, a decoder program. Microprocessor 158 may receive a clock signal from clock 156. Microprocessor 158 may retrieve the decoder program from program memory 162. Microprocessor 158 may receive a stream of encoded data from encoder 106 via input/output interface 164. Microprocessor 158 may then decode the encoded data stream according to program instructions contained in the decoder program. Microprocessor 158 may store compressed and/or uncompressed data in data memory 160. Microprocessor 158 may then output uncompressed data to node 140 via input/output interface 164.

FIG. 2 depicts an exemplary embodiment of a decoder and an encoder for compressing a stream of binary data, such as the data depicted in table 112 of FIG. 1. In some embodiments, an FPGA may be configured to receive a stream of digital and/or analog data. The FPGA may be configured to convert the data from analog to digital form if necessary. The FPGA may be configured to compress the data according to methods described herein. In some embodiments, a microcontroller and/or a microprocessor may run a compression and/or decompression program, for example. In some embodiments a microcontroller and/or a microprocessor can be embedded in an FPGA. In some embodiments, a microprocessor and/or a microcontroller can be used instead of an FPGA. Embedded microprocessors and/or microcontrollers can be hardware or can be implemented by configuring the FPGA, which is sometimes called soft cores.

Figure 3:
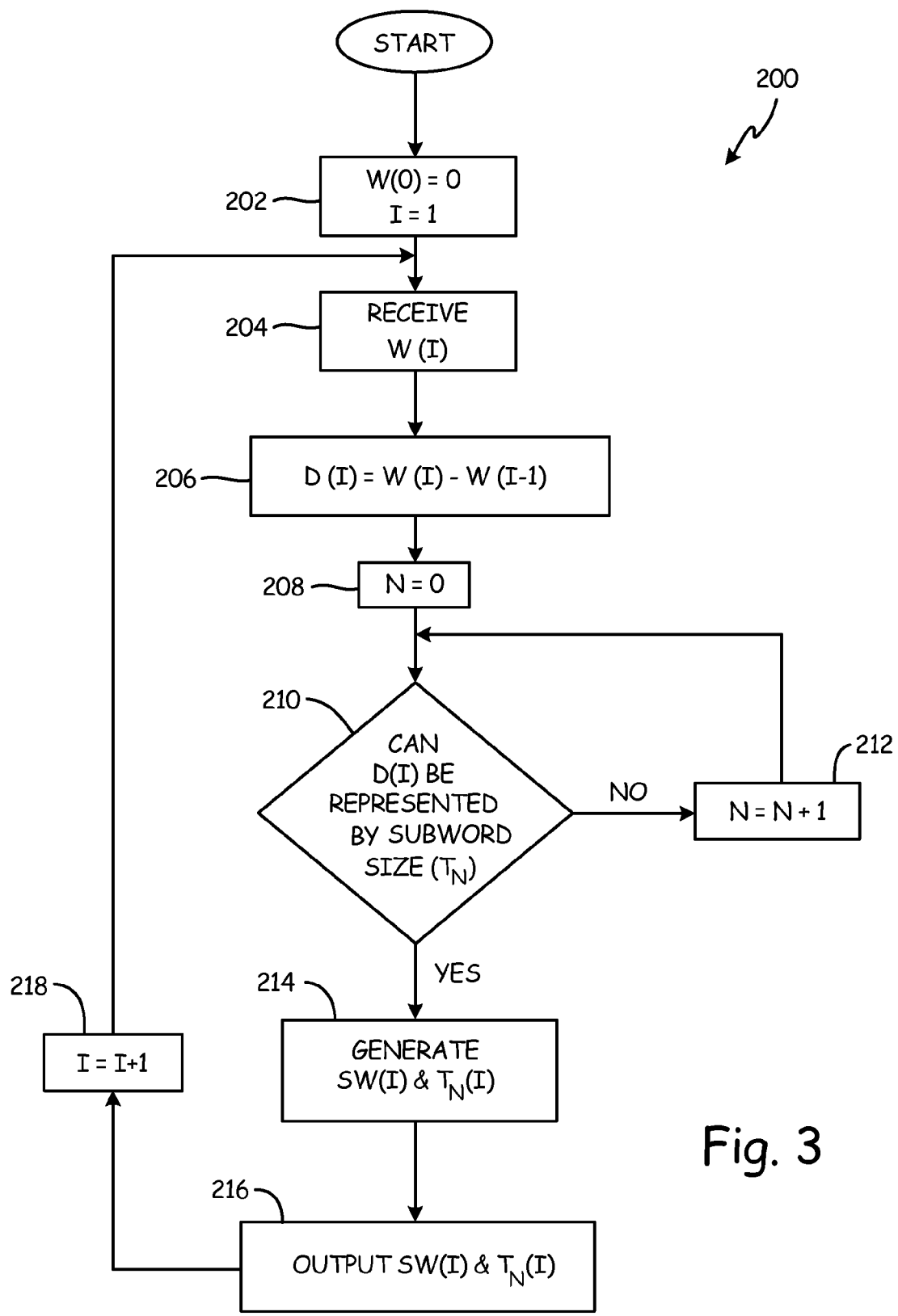
FIG. 3 is a flow chart of an exemplary method of compressing a sequence of words of binary data.

FIG. 3 is a flow chart of an exemplary method of compressing a sequence of words of binary data. In FIG. 3, method 200 for compressing a sequence of words of binary data is described from the vantage point of microprocessor 144 of FIG. 2. Method 200 begins at step 202, in which microprocessor 144 initializes index I and first data word W(0). Word W(0) is initialized to zero and index I is initialized to 1. Then at step 204, microprocessor 144 receives Word W(I) from A/D converter 104 via input/output interface 150. Then at step 206, microprocessor 144 compares the last two words, W(I−1) and W(I), and creates a difference word, D(I).

At step 208, microprocessor 144 initializes index N to zero. Then at step 210, microprocessor 144 determines if difference word D(I) can be represented in subword size $T_N$. If at step 210, microprocessor 144 determines that difference word D(I) cannot be represented by subword size $T_N$ then method 200 proceeds to step 212. At step 212, microprocessor increments index N and the method returns to step 210. In this exemplary method, index N is used to index from a set of $N_{MAX}$ predetermined subword sizes. When index N is zero, the difference word D(I) is tested against the smallest one of the set of predetermined subword sizes. Then as N is incremented, each successive corresponding subword is larger than the previously tested subword. The last subword size tested is equal in length to the uncompressed word, and so microprocessor 144 will always determine that difference word D(I) can be represented by this last one of the set of predetermined subword sizes.

If, however, at step 210, microprocessor 144 determines that difference word D(I) can be represented by subword size $T_N$ then method 200 proceeds to step 214. At step 214, microprocessor 144 generates size tag $T_N(I)$ and subword $SW_T(I)$. Size tag $T_N(I)$ may be indicative of a subword size selected from a set of predetermined subword sizes. Subword $SW_T(I)$ represents the determined difference D(I) between the last two words, W(I−1) and W(I). The method continues to step 216, where microprocessor 144 outputs the generated size tag $T_N(I)$ and subword $SW_T(I)$ to output node 116 via input/output interface 150. Then at step 218, microprocessor 144 increments index I. Method 200 then returns to step 204 where microprocessor 144 will receive the next word W(I).

Figure 4:
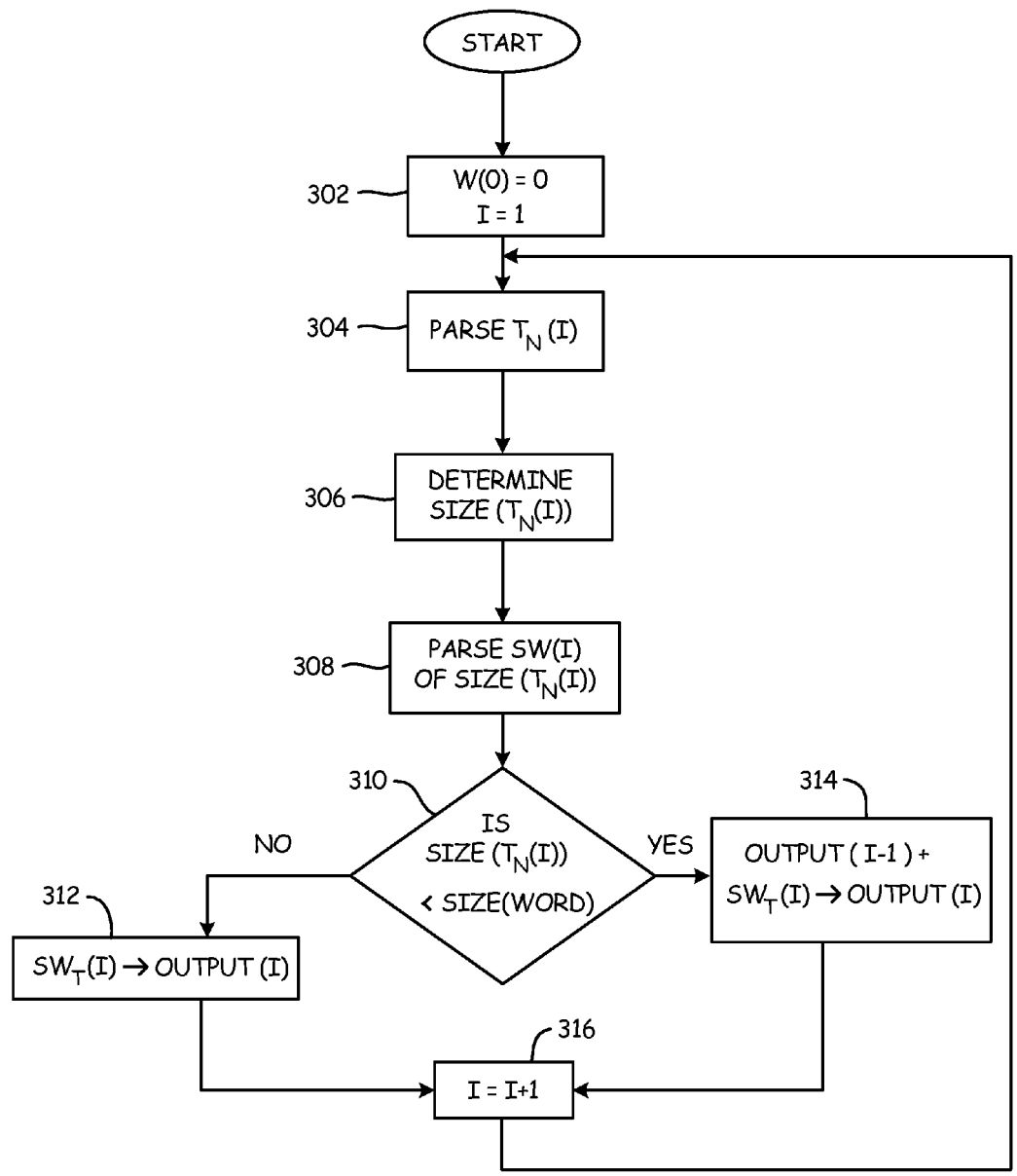
FIG. 4 is a flow chart of an exemplary method of uncompressing a compressed sequence of binary data.

FIG. 4 is a flow chart of an exemplary method of uncompressing a compressed sequence of binary data. In FIG. 4, method 300 for uncompressing a sequence of binary data is described from the vantage point of microprocessor 144 of FIG. 2. Method 300 begins at step 302 at which step microprocessor 144 initializes index I and first data word W(0). Word W(0) is initialized to zero and index I is initialized to 1. Then at step 304, microprocessor 144 parses size tag $T_N(I)$ from the sequence of binary data. The sequence of binary data may be received from encoder 106 via input/output interface 164, for example. At step 306, microprocessor 144 determines a subword size that corresponds to the parsed size tag $T_N(I)$. At step 308, microprocessor 144 parses a subword of the determined subword size from the sequence of binary data.

At step 310, microprocessor determines if size tag $T_N(I)$ indicates a subword size that is indicative of a bit-representation of an uncompressed word. If at step 310, microprocessor 144 determines that size tag $T_N(I)$ is indicative of a bit representation of an uncompressed word, the method proceeds to step 312. At step 312, microprocessor 144 outputs the parsed uncompressed subword as a next element. In some embodiments a size tag $T_N(I)$ equal to bit pattern 00, for example, may be indicative of a corresponding subword that is representative of an uncompressed word of the sequence. In some embodiments, the entire uncompressed word from the sequence is received. In other embodiments all but the least significant bit or bits is received.

If, however, at step 310, microprocessor 144 determines that size tag $T_N(I)$ is not indicative of a bit representation of an uncompressed word, the method proceeds to step 314. At step 314, microprocessor 144 generates the next element and outputs the generated next element. In generating the next element at step 314, microprocessor 144 interprets the parsed subword as indicative of a difference between the previous element and the next element being generated.

In some embodiments, microprocessor 144 interprets the parsed subword as a mathematical difference. In such embodiments, microprocessor will add (or subtract) the parsed subword to the previous element. In some embodiments, microprocessor 144 interprets the parsed subword as a bit-pattern difference. In such embodiments, microprocessor will replace (or exclusive or) a corresponding subword portion of the previous element with the parsed subword. After both steps 312 and 314, the method proceeds to step 316. At step 316, microprocessor 144 increments index, I, and the method then returns to step 304 where microprocessor 144 will parse the next size tag from the sequence of binary data.

Figure 5:
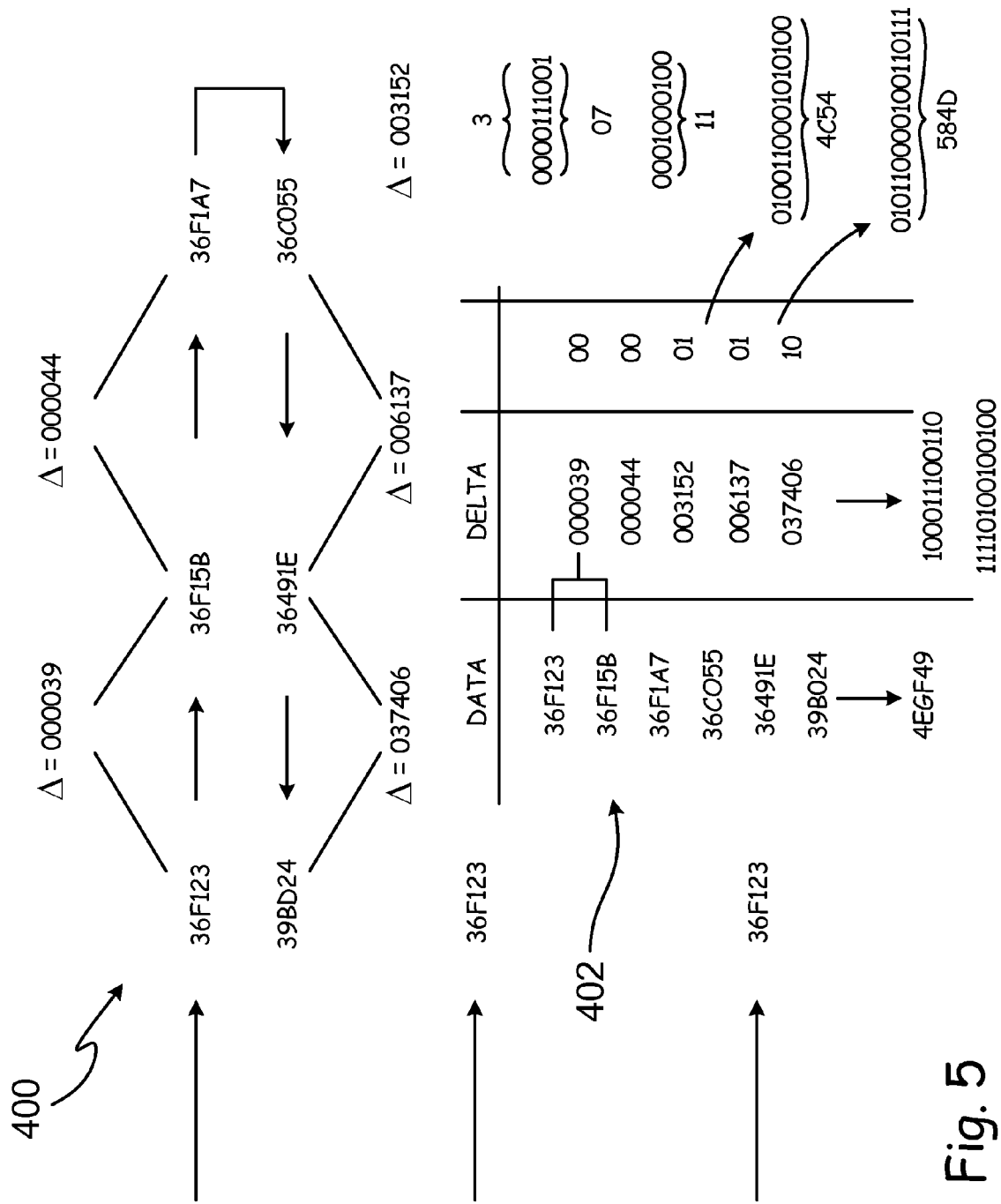
FIG. 5 is a schematic representation of an exemplary sequence of words of binary data, both compressed and uncompressed.

FIG. 5 is a schematic representation of an exemplary sequence of words of binary data, both compressed and uncompressed. In FIG. 5, a sequence 400 of data expressed in hexadecimal format is depicted. The sequence 400 is also annotated in table 402. Each datum 404 is shown in spatial relation with every other datum 404. The spatial relation represents a temporal ordering of each datum 404. Thus, datum 36F123 is the first in the sequence, and datum 39BD24 is the last in the sequence. A mathematical difference 406 is determined between adjacent data.

The first mathematical difference between the first two data elements can be expressed in hexadecimal as 000039. Such a small difference can be represented using an 8-bit subword. The third mathematical difference between the third and fourth data elements can be expressed in hexadecimal as 003152. Such a difference can be represented using a 16-bit subword. The last difference between the fifth and sixth data elements can be expressed as 037406. Such a difference cannot be expressed in a 16-bit subword. Such a sequence of data may use a compression scheme that includes an 8-bit subword size and a 16-bit subword size in a set of predetermined subword sizes. Instead of encoding the last difference, the sixth datum can simply be transmitted along with a size tag that indicates such a 24-bit datum.

A 2-bit size tag is sufficient to express the three possible appended subwords: i) 24-bit uncompressed datum; ii) 16-bit difference value; and iii) 8-bit difference value. In some embodiments, the two least-significant bits of one or more of the subwords may be excised such that the total transmission lengths are: i) 24 bits; ii) 16 bits; and iii) 8 bits, for the respective subword sizes (22 bits, 14 bits and 6 bits) prepended by the 2-bit size tag. Excising the two least-significant bits results in a loss of resolution, which can be acceptable in certain circumstances, such as when these least-significant bits are noisy.

Various embodiments will used various subword lengths for encoding differences between adjacent data in a sequence. Slowly varying data may yield differences between adjacent data that can be represented using few bits.

Thus, depending on the rate of data variation, different sets of subword lengths may provide better or worse compression ratios. For example, a subword length of 8 bits will be capable of representing a plus or minus 127 count difference between adjacent data. If an average variation between adjacent data is about 64 counts, then an 8-bit subword will be capable of representing a majority of these differences. A set of predetermined subword lengths for such a system may include 6-bit subwords, 8-bit subwords and 12-bit subwords, for example. A 2-bit size tag may be prepended to the encoded subword. The size tag may be coded to identify the size of the subword to which it is prepended. For example, a size tag of 00 may indicate that corresponding word is a 24-bit uncompressed datum. A size tag of 01 may indicate that the corresponding subword is a 12-but subword. Size tags of 10 and 11 may indicate that the appended subwords are 8 and 6 bits, respectively.

A binary data encoding system for compressing a sequence of binary data includes a receiver configured to receive a sequence of words of binary data. The binary data encoding system includes a comparator configured to compare pairs of adjacent words of the sequence, and to determine a difference between a second word and a first word of each of the pairs of adjacent words. The binary data encoding system includes a selector configured to select a subword size from a set of predetermined subword sizes. The selected subword size is a minimum one of the set of predetermined subword sizes that are capable of representing the determined difference between the second word and the first word of each of the pairs of adjacent words. The binary data encoding system includes an encoding engine configured to generate a size tag and a corresponding subword of the selected subword size. The size tag indicates the selected subword size and the corresponding subword represents the determined difference between the second word and the first word of each of the pairs of adjacent words. The binary data encoding system also includes a buffer configured to output the generated size tag and subword.

A further embodiment of the foregoing binary data encoding system, wherein the encoding engine can be further configured to generate a representation of the second word of the pair of adjacent words that corresponds to the determined difference, if the determined difference is incapable of being represented by any one of the set of predetermined subword sizes. A further embodiment of any of the foregoing binary data encoding systems, wherein the encoding engine can be further configured to generate the size tag indicative of the generated representation of the second word of the pair of adjacent words corresponding to the determined difference, if the determined difference is incapable of being represented by any one of the set of predetermined subword sizes. A further embodiment of any of the foregoing binary data encoding systems, wherein the buffer can be further configured to output the generated size tag and the representation of the second word of the pair of adjacent words corresponding to the determined difference, if the determined difference is incapable of being represented by any one of the set of predetermined subword sizes.

A further embodiment of any of the foregoing binary data encoding systems, wherein the receiver can be configured to receive a sequence of words of binary data from an A/D converter. A further embodiment of any of the foregoing binary data encoding systems, wherein the comparator can determine a mathematical difference between each of the pairs of adjacent words. A further embodiment of any of the foregoing binary data encoding systems, wherein the generated subword can represent the mathematical difference determined by the comparator. A further embodiment of any of the foregoing binary data encoding systems, wherein the comparator can determine a bit-pattern difference between each of the pairs of adjacent words. A further embodiment of any of the foregoing binary data encoding systems, wherein the generated subword can represent the bit-pattern difference determined by the comparator. A further embodiment of any of the foregoing binary data encoding systems, wherein the size tag can have a length that is less than or equal to two bits.

A binary data decoding system for uncompressing a compressed sequence of data elements includes a receiver configured to receive the compressed sequence of data elements. Each of the data elements includes a size tag and a corresponding word or subword. The size tag indicates either a representation of a word or a subword size. The binary data decoding system includes a parser configured to parse the size tag and the corresponding word or subword from the received data elements. If the size tag indicates a representation of a word, the parser parses a representation of a word. If, however, the size tag indicates a subword size, the parser parses a subword of the indicated subword size. The binary data decoding system also includes a decoding engine configured to generate an uncompressed word from the parsed size tag and the corresponding parsed word or subword. If the size tag indicates a representation of a word, the representation of the word is output as a next element. If, however, the size tag indicates a subword size, the parsed subword is used to modify a previous element to generate and output the next element.

A further embodiment of the foregoing binary data decoding system, wherein the parsed subword can represent a mathematical difference between each of the pairs of adjacent words. A further embodiment of any of the foregoing binary data decoding systems, wherein the parsed subword can represent a bit-pattern difference between each of the pairs of adjacent words. A further embodiment of any of the foregoing binary data decoding systems, wherein the size tag can have a length that is less than or equal to two bits.

A method of reducing a bandwidth required to communicate a sequence of words of binary data includes the step of receiving a first binary word of data. The method includes the step of receiving a second binary word of data. The method includes the step of comparing the second binary word of data with the first binary word of data. The method includes the step of determining a difference between the first binary word of data and the second binary word data. The method includes the step of selecting a subword size from a set of predetermined subword sizes, the selected subword size being capable of representing the determined difference. The method includes the step of generating a subword of the selected subword size, the subword representing the determined difference. The method also includes the step of outputting the generated subword and a tag indicating the selected subword size of the generated subword.

The method of the preceding paragraph can optionally include, additionally and/or alternatively, any one or more of the following steps: i) receiving the compressed stream of binary data; ii) parsing, from the compressed stream of binary data, a size tag indicative of a size of a corresponding datum; iii) determining, using the size tag, if the corresponding datum is a word or a subword; iv) parsing, from the compressed stream of binary data, the word or the subword determined using the size tag; v) providing, if a word is parsed from the binary steam of data, the parsed word as a next element; and vi) modifying, if a subword is parsed from the binary stream of data, a previous element using the parsed subword and providing the modified previous element as the next element.

A further embodiment of any of the foregoing methods, wherein determining a difference between the first binary word of data and the second binary word of data can include determining a bit-pattern difference between the first binary word of data and the second binary word of data. A further embodiment of any of the foregoing methods, wherein determining a difference between the first binary word of data and the second binary word of data can include determining a mathematical difference between the first binary word of data and the second binary word of data. A further embodiment of any of the foregoing methods, wherein the set of predetermined subword sizes can include a subword size of the uncompressed word. A further embodiment of any of the foregoing methods, wherein the set of predetermined subword sizes can include a subword size eight bits.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A binary data encoding system for compressing a sequence of binary data, the binary data encoding system comprising:
    a microprocessor; and
    computer-readable memory encoded with instructions that, when executed by the microprocessor, cause the binary data encoding system to:
    receive a sequence of words of binary data;
    compare pairs of adjacent words of the sequence, and to determine a difference between a second word and a first word of each of the pairs of adjacent words;
    select a subword size from a set of predetermined subword sizes, the selected subword size being a minimum one of the set of predetermined subword sizes that are capable of representing the determined difference between the second word and the first word of each of the pairs of adjacent words;
    generate a size tag and a corresponding subword of the selected subword size, the size tag indicative of the selected subword size and the corresponding subword representing the determined difference between the second word and the first word of each of the pairs of adjacent words; and
    output the generated size tag and subword.

2. The binary data encoding system of claim 1, wherein the computer-readable memory is further encoded with instructions that, when executed by the microprocessor, cause the binary data encoding system to:
    generate a representation of the second word of the pair of adjacent words that corresponds to the determined difference, if the determined difference is incapable of being represented by any one of the set of predetermined subword sizes.

3. The binary data encoding system of claim 2, wherein the computer-readable memory is further encoded with instructions that, when executed by the microprocessor, cause the binary data encoding system to:
    generate the size tag indicative of the generated representation of the second word of the pair of adjacent words corresponding to the determined difference, if the determined difference is incapable of being represented by any one of the set of predetermined subword sizes.

4. The binary data encoding system of claim 3, wherein the computer-readable memory is further encoded with instructions that, when executed by the microprocessor, cause the binary data encoding system to:
    output the generated size tag and the representation of the second word of the pair of adjacent words corresponding to the determined difference, if the determined difference is incapable of being represented by any one of the set of predetermined subword sizes.

5. The binary data encoding system of claim 1, wherein the computer-readable memory is further encoded with instructions that, when executed by the microprocessor, cause the binary data encoding system to:
    receive a sequence of words of binary data from an A/D converter.

6. The binary data encoding system of claim 1, wherein the computer-readable memory is further encoded with instructions that, when executed by the microprocessor, cause the binary data encoding system to:
    determine a mathematical difference between each of the pairs of adjacent words.

7. The binary data encoding system of claim 6, wherein the generated subword represents the determined mathematical difference.

8. The binary data encoding system of claim 1, wherein the computer-readable memory is further encoded with instructions that, when executed by the microprocessor, cause the binary data encoding system to:
    Determine a bit-pattern difference between each of the pairs of adjacent words.

9. The binary data encoding system of claim 8, wherein the generated subword represents the determined bit-pattern difference.

10. The binary data encoding system of claim 1, wherein the size tag has a length that is less than or equal to two bits.

11. A binary data decoding system for uncompressing a compressed sequence of data elements, the binary data decoding system comprising:
    a microprocessor; and
    computer-readable memory encoded with instructions that, when executed by the microprocessor, cause the binary data encoding system to:
    receive the compressed sequence of data elements, each of the data elements including a size tag and a corresponding word or subword, the size tag indicative of either a representation of a word or a subword size;
    parse the size tag and the corresponding word or subword from the received data elements, wherein if the size tag indicates a representation of a word, the parser parses a representation of a word, wherein if the size tag indicates a subword size, the parser parses a subword of the indicated subword size; and
    generate an uncompressed word from the parsed size tag and the corresponding parsed word or subword, wherein, if the size tag indicates a representation of a word, the representation of the word is output as a next element; wherein, if the size tag indicates a subword size, the parsed subword is used to modify a previous element to generate and output the next element.

12. The binary decoding system of claim 11, wherein the parsed subword represents a mathematical difference between each of the pairs of adjacent words.

13. The binary data decoding system of claim 11, wherein the parsed subword represents a bit-pattern difference between each of the pairs of adjacent words.

14. The binary data decoding system of claim 11, wherein the size tag has a length that is less than or equal to two bits.

15. A method of reducing a bandwidth required to communicate a sequence of words of binary data comprising:
receiving a first binary word of data;
receiving a second binary word of data;
comparing the second binary word of data with the first binary word of data;
determining a difference between the first binary word of data and the second binary word data;
selecting a subword size from a set of predetermined subword sizes, the selected subword size being capable of representing the determined difference;
generating a subword of the selected subword size, the subword representing the determined difference; and
outputting the generated subword and a tag indicating the selected subword size of the generated subword.

16. The method of claim 15, wherein determining a difference between the first binary word of data and the second binary word of data comprises determining a bit-pattern difference between the first binary word of data and the second binary word of data.

17. The method of claim 15, wherein determining a difference between the first binary word of data and the second binary word of data comprises determining a mathematical difference between the first binary word of data and the second binary word of data.

18. The method of claim 15, wherein the set of predetermined subword sizes includes a subword size of the second binary word.

19. The method of claim 15, wherein the set of predetermined subword sizes includes a subword size eight bits.

20. The method of claim 15, further comprising:
receiving the compressed stream of binary data;
parsing, from the compressed stream of binary data, a size tag indicative of a size of a corresponding datum;
determining, using the size tag, if the corresponding datum is a word or a subword;
parsing, from the compressed stream of binary data, the word or the subword determined using the size tag;
providing, if a word is parsed from the binary steam of data, the parsed word as a next element; and
modifying, if a subword is parsed from the binary stream of data, a previous element using the parsed subword and providing the modified previous element as the next element.

* * * * *